(12) United States Patent
Pfeiffer-Jacob

(10) Patent No.: US 12,439,767 B2
(45) Date of Patent: Oct. 7, 2025

(54) FIELD-WIDTH ADJUSTMENT OF CELLS IN A PHOTOVOLTAIC ELEMENT

(71) Applicant: Heliatek GmbH, Dresden (DE)

(72) Inventor: Martin Pfeiffer-Jacob, Dresden (DE)

(73) Assignee: HELIATEK GMBH, Dresden (DE)

( * ) Notice: Subject to any disclaimer, the term of this patent is extended or adjusted under 35 U.S.C. 154(b) by 26 days.

(21) Appl. No.: 18/254,863

(22) PCT Filed: Nov. 30, 2021

(86) PCT No.: PCT/DE2021/100949
§ 371 (c)(1),
(2) Date: May 29, 2023

(87) PCT Pub. No.: WO2022/111765
PCT Pub. Date: Jun. 2, 2022

(65) Prior Publication Data
US 2024/0306406 A1    Sep. 12, 2024

(30) Foreign Application Priority Data
Nov. 30, 2020  (DE) .................. 10 2020 131 742.5

(51) Int. Cl.
*H10K 39/12*   (2023.01)
*H10K 30/81*   (2023.01)
*H10K 30/88*   (2023.01)

(52) U.S. Cl.
CPC ............. *H10K 39/12* (2023.02); *H10K 30/81* (2023.02); *H10K 30/88* (2023.02)

(58) Field of Classification Search
CPC .. H10F 19/30–37; H10F 19/90; H10F 19/902; H10F 19/904; H10F 77/215;
(Continued)

(56) References Cited

U.S. PATENT DOCUMENTS

| 2007/0090371 A1 | 4/2007 | Drechsel et al. |
| 2008/0083448 A1* | 4/2008 | Borden ............... H10F 19/31 136/243 |

(Continued)

FOREIGN PATENT DOCUMENTS

| CN | 210110789 U | 2/2020 |
| DE | 202007010590 U1 | 12/2008 |

(Continued)

OTHER PUBLICATIONS

JP-2012004289-A English machine translation (Year: 2012).*

(Continued)

*Primary Examiner* — Andrew J Golden
(74) *Attorney, Agent, or Firm* — LEYDIG, VOIT & MAYER, LTD.

(57) ABSTRACT

A photovoltaic element including a number n of cells arranged on a substrate, from a first cell to an n-th cell and at least one busbar connected to the first cell and/or the n-th cell by an electrically conductive contacting. The cells each have a bottom electrode, a top electrode and a layer system including at least one photoactive layer. The layer system is arranged between the bottom electrode and the top electrode, and the cells are interconnected in series among one another. The electrically conductive contacting is formed by via points arranged in each case at specific distances A from one another in a longitudinal direction of the at least one busbar. No electrically conductive contacting is formed between the top electrode and the at least one busbar in regions between individual via points.

19 Claims, 5 Drawing Sheets

(58) Field of Classification Search
CPC ...... H10F 77/939; H10K 39/12; H10K 30/88; H10K 30/81
See application file for complete search history.

(56) References Cited

U.S. PATENT DOCUMENTS

| | | |
|---|---|---|
| 2009/0266401 A1 | 10/2009 | Stangl et al. |
| 2011/0259403 A1* | 10/2011 | Myong .................. H10F 19/33 |
| | | 438/73 |
| 2012/0090680 A1* | 4/2012 | Yagiura ................ H10F 19/804 |
| | | 257/E31.124 |
| 2013/0056758 A1 | 3/2013 | Ziltener et al. |
| 2013/0104968 A1 | 5/2013 | Pfeiffer et al. |
| 2013/0291938 A1* | 11/2013 | Nakahara ................ H10F 19/35 |
| | | 438/69 |
| 2015/0136197 A1* | 5/2015 | Kim ........................ H10F 19/31 |
| | | 136/244 |

FOREIGN PATENT DOCUMENTS

| | | |
|---|---|---|
| EP | 0582211 A1 | 2/1994 |
| EP | 2466640 A2 | 6/2012 |
| EP | 2033228 B1 | 5/2014 |
| JP | 2012004289 A * | 1/2012 |
| JP | 2014192196 A | 10/2014 |
| WO | WO 2004083958 A2 | 9/2004 |
| WO | WO 2011138021 A2 | 11/2011 |

OTHER PUBLICATIONS

Molpeceres et al, Optical characterization of the heat-affected zone in laser patterning of thin film a-Si:H, Laser-based Micro -and Nanopackaging and Assembly III vol. 7202, pp. 260-269 SPIE (Year: 2018).*

* cited by examiner

FIELD-WIDTH ADJUSTMENT OF CELLS IN A PHOTOVOLTAIC ELEMENT

CROSS REFERENCE TO RELATED APPLICATIONS

This application is a U.S. National Phase application under 35 U.S.C. § 371 of International Application No. PCT/DE2021/100949, filed on Nov. 30, 2021, and claims benefit to German Patent Application No. DE 10 2020 131 742.5, filed on Nov. 30, 2020. The International Application was published in German on Jun. 2, 2022 as WO 2022/111765 A1 under PCT Article 21(2).

FIELD

The invention relates to a photovoltaic element.

BACKGROUND

Optoelectronics is composed of the field of optics and semiconductor electronics. It encompasses in particular systems and methods which enable electronically generated energy to be converted into light emission or convert light emissions into energy. Optoelectronic components, in particular photovoltaic elements, for example organic photovoltaic elements (OPVs), and organic light emitting diodes (OLEDs), generate electrical energy or convert electrical energy into light emissions, which for application purposes thereafter has to be led out of the optoelectronic component or led in. The electric current is usually conducted away by means of busbars applied at the edge of an electrode. For contacting purposes, junction boxes are arranged on the photovoltaic element in the region of the busbars.

Organic photovoltaic elements consist of a sequence of thin layers comprising at least one photoactive layer, which preferably are applied by vapor deposition in a vacuum or are processed from a solution. The electrical linking can be effected by means of metal layers, transparent conductive oxides and/or transparent conductive polymers. The vacuum vapor deposition of the organic layers is advantageous in particular in the production of multilayered solar cells, in particular tandem or triple cells.

Photovoltaic elements have a layer stack comprising layers. The layer stack usually comprises electrode layers, in particular composed of an electrically conductive transparent material, a transparent conductive metal oxide (TCO—transparent conductive oxide), one or more photoactive layers, and an electrode layer. In the case of transparent or semitransparent photovoltaic elements, it is also possible for both electrodes to be metallic. A possible structure of the layer system of a photovoltaic element is described in WO2004083958A2 and WO2011138021A2.

Organic photovoltaic elements can be produced for example by evaporation of the materials, by printing of polymers or by processing from liquids. Organic photovoltaic elements are structured by means of laser processes. These methods are used in particular for interconnecting individual photovoltaic cells on an optoelectronic component, and also for electrically isolating photovoltaic cells. Owing to a limited conductivity of the layer systems and for the purpose of adapting the output voltages and output currents of photovoltaic elements, the photovoltaic element, i.e. the layer system of the photovoltaic element, is usually subdivided into cells arranged next to one another, which are interconnected in series among one another. In this case, the width of such cells is usually in the range of approximately a few millimeters to centimeters.

The conventional solution for solar cells, in particular organic solar cells, which are particularly critical with regard to mechanical and chemical damage, consists in connecting the busbars to the respective cell over the entire width or at least with via points at a short distance. Such via points, in particular single-sided contact solar cells comprising via points, are known from the prior art.

EP 2 033 228 B1 discloses a single-sided contact solar cell comprising at least one absorber layer structured with vias and an emitter layer composed of semiconductor materials, said emitter layer being arranged over the whole area on one side of the absorber layer, wherein excess charge carriers are collected and dissipated in the absorber layer by way of two contact systems arranged jointly on one side of the absorber layer, said contact systems being electrically contacted externally and being insulated from one another.

EP 2 466 640 A2 discloses a thin-film photovoltaic module subdivided into a multiplicity of photovoltaic cells that are arranged on a substrate and are electrically interconnected in series in an integrated manner by means of separating lines that sever at least one layer of a layer stack of the thin-film photovoltaic module, wherein at least two of the separating lines run non-parallel to one another, at least one portion of the separating lines is part of a series interconnection strip that interconnects two adjoining photovoltaic cells in series, and at least one of the separating lines severs all layers of the thin-film photovoltaic module and insulates two adjoining photovoltaic cells from one another.

The prior art likewise discloses cells of different formats in photovoltaic elements, the cells having an identical area.

DE 20 2007 010 590 U1 discloses a solar module comprising a multiplicity of individual interconnected solar cells having an identical area, wherein transparent or translucent regions are provided between the solar cells, and wherein at least two different formats of solar cells are provided.

Since the obtained current of a cell of a photovoltaic element is proportional to the area of the cell, a cell that is partly damaged or not fully functional yields a smaller current, where in the case of series-connected cells the cell with the lowest current, in particular the smallest area, determines the current of the photovoltaic element.

The electrical connection between the first or respectively last cell within a module comprising series-connected cells and the respective busbar is particularly problematic. Firstly, connection is often accompanied by the formation of local damage in the photoactive layer system, for example as a result of mechanical loading if a conductive pressure sensitive adhesive (PSA) containing metal particles is pressed on and/or as a result of chemical damage if conductive adhesives are used. Secondly, primarily in association with a barrier layer or an encapsulation, the electrical connection between the cells, which are intended to be protected from moisture and atmospheric oxygen as hermetically as possible, and the busbar, which is typically situated outside the encapsulated zone, is critical vis-à-vis ingress of moisture and atmospheric oxygen.

What is disadvantageous about the prior art, therefore, is that the cell beneath the busbar is photovoltaically completely or at least largely inactive, i.e. does not contribute to the efficiency of the module. This leads to a significant loss of efficiency, particularly if relatively wide busbars are required, for example with a width of more than 1 cm, as is the case if the current from a very long module is intended to be transported away.

SUMMARY

In an embodiment, the present disclosure provides a photovoltaic element comprising a number n of cells arranged on a substrate, from a first cell to an n-th cell and at least one busbar connected to the first cell and/or the n-th cell by an electrically conductive contacting. The cells each have a bottom electrode, a top electrode and a layer system comprising at least one photoactive layer. The layer system is arranged between the bottom electrode and the top electrode, and the cells are interconnected in series among one another. The electrically conductive contacting connects the at least one busbar with the top electrode of the first cell and/or the top electrode of the n-th cell and is formed by via points arranged in each case at specific distances A from one another in a longitudinal direction of the at least one busbar. No electrically conductive contacting is formed between the top electrode and the at least one busbar in regions between individual via points. A surrounding zone around the via points, in a surrounding circle with a diameter of less than A/2, is not photoactive or is at least photoactive to a reduced extent.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
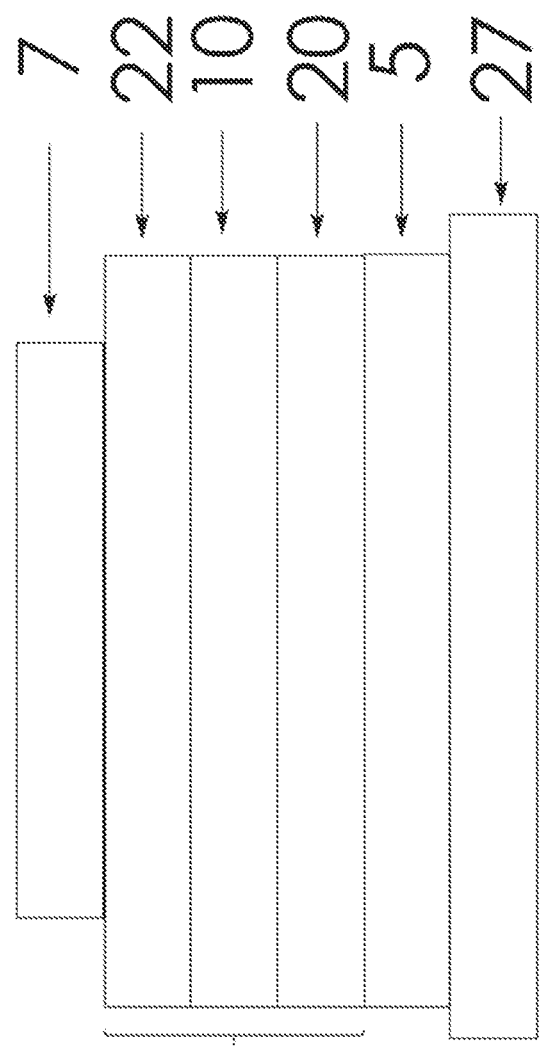
FIG. 1 shows a schematic illustration of an exemplary embodiment of a layer system of a cell of a photovoltaic element in a side view.

In an embodiment, the invention provides a photovoltaic element where the disadvantages mentioned do not occur or are at least reduced, and where in particular the harmful influence of a busbar on a cell comprising such a busbar is minimized, where a photovoltaic element having a better efficiency and/or an increased lifetime is obtained. An embodiment of the present invention provides a photovoltaic element comprising a number n of cells arranged on a substrate, from a first cell to an n-th cell, wherein the cells each have a bottom electrode, a top electrode and a layer system comprising at least one photoactive layer, wherein the layer system is arranged between the bottom electrode and the top electrode, and the cells are interconnected in series among one another, wherein the photovoltaic element has at least one busbar connected to the first cell and/or the n-th cell by means of an electrically conductive contacting. The electrically conductive contacting of the at least one busbar with the top electrode of the first cell and/or the top electrode of the n-th cell is formed by means of via points arranged in each case at specific distances A from one another in the longitudinal direction of the busbar, preferably at periodic distances, wherein no electrically conductive contacting is formed between the top electrode and the at least one busbar in regions between the individual via points, and wherein a surrounding zone around the via points, in a surrounding circle with a diameter of less than A/2, preferably less than A/4, is not photoactive or is at least photoactive to a reduced extent.

According to an embodiment of the invention, the first cell and/or the n-th cell are/is electrically conductively connected to the at least one busbar by means of the via points, so-called vias. Preferably, the electrically conductive contacting of the at least one busbar with the first cell or the n-th cell is not present throughout, but rather at the via points each at a specific distance A from one another. Preferably, the at least one busbar is not electrically conductively connected to the top electrode over the entire length of the cell.

In a preferred embodiment of the invention, the photoactive area of the first cell and/or of the n-th cell beneath the at least one busbar is sufficiently large in comparison with the cells 2 to n−1, thereby ensuring that a photocurrent generation of the first cell and/or of the n-th cell beneath the at least one busbar is at least of the same magnitude as for the other cells of the series interconnection of the photovoltaic element, wherein preferably the width of the first cell and/or of the n-th cell beneath the at least one busbar is increased in comparison with the cells 2 to n−1.

Preferably, therefore, the first cell and/or the n-th cell are/is somewhat higher in regard to an efficiency before aging as a result of an increased area, in particular as a result of an increased width, in comparison with the cells 2 to n−1, thereby ensuring that the respective cell does not become the current-limiting cell within the series-interconnected cells of the photovoltaic element even if ingress of moisture at the first cell and/or the n-th cell beneath a busbar results in an accelerated degradation of said cell.

In a preferred embodiment of the invention, the bottom electrode, the layer system and the top electrode are laser-structured. In a preferred embodiment of the invention, the individual cells of the photovoltaic element are interconnected in series with one another by means of laser structuring.

In a preferred embodiment of the invention, the top electrode and/or the bottom electrode comprise(s) silver or a silver alloy, aluminum or an aluminum alloy, gold or a gold alloy, or a combination of these materials, a conductive oxide, in particular ITO, ZnO, ZnO:Al, $SnO_2$, or some other TCO (transparent conductive oxide), a conductive polymer, in particular PEDOT/PSS (poly(3,4-ethylenedioxythiophene)-poly(styrenesulfonate) or PANI (polyaniline). Furthermore, the top electrode and/or the bottom electrode can have a network of metal nanowires or metal nanoparticles, the metal preferably being silver, copper or gold.

In a preferred embodiment of the invention, the bottom electrode is arranged on a substrate, in particular a film.

A photovoltaic element is understood to mean in particular a photovoltaic cell, in particular a solar cell. The photovoltaic element is preferably constructed from a plurality of photovoltaic cells which can be interconnected in series or in parallel. The plurality of photovoltaic cells can be arranged and/or interconnected in various ways in the photovoltaic element.

In a preferred embodiment of the invention, the at least one via point is formed in punctiform, linear, or grid-shaped fashion. In a preferred embodiment of the invention, the via point comprises a multiplicity of smaller via points, preferably a pattern of circles or rectangles, on an area of less than one $cm^2$. This is advantageous in particular if a contact resistance of the via point does not scale with the area, but rather with the total length of the edges.

In a preferred embodiment of the invention, via points are formed at a distance of at least 2 cm, preferably at least 5 cm, preferably at least 10 cm, or preferably at least 20 cm, between the first and/or n-th cell and the at least one busbar.

A busbar is understood to mean in particular an arrangement which, for the purpose of electrical contacting as a central distributor of electrical energy, is electrically conductively connected to incoming and outgoing lines, preferably with at least one bottom electrode and/or at least one top electrode. The at least one busbar is at least partly electrically conductively contacted at the bottom electrode or the top electrode. The busbar is formed in particular in planar fashion as a ribbon, a strip, a plate or as a metal layer.

In a preferred embodiment, the at least one busbar has a layer thickness of 10 μm to 500 μm, preferably of 100 μm to 500 μm, preferably of 10 μm to 200 μm, preferably of 10 μm to 100 μm, preferably of 10 μm to 50 μm, or preferably of 20 μm to 40 μm.

In a preferred embodiment of the invention, the at least one busbar is formed from a metal or an alloy thereof, preferably from copper and tin.

An organic photovoltaic element is understood to mean in particular a photovoltaic element comprising at least one organic photoactive layer, in particular a polymeric organic photovoltaic element or an organic photovoltaic element based on small molecules. The photoactive layers form acceptor-donor systems, in particular, and can comprise a plurality of individual layers, or mixed layers.

Small molecules are understood to mean in particular non-polymeric organic molecules having monodisperse molar masses of between 100 and 2000 g/mol, which are present in a solid phase under standard pressure (air pressure of the atmosphere surrounding us) and at room temperature. In particular, the small molecules are photoactive, where photoactive is understood to mean that the molecules change their state of charge and/or their state of polarization when subjected to light incidence. Advantages of these absorber materials based on small molecules are evaporability in a vacuum.

In a preferred embodiment of the invention, the at least one photoactive layer of the layer system comprises small molecules which are evaporable in a vacuum. In a preferred embodiment of the invention, at least one photoactive layer of the layer system is applied by vapor deposition in a vacuum.

In a preferred embodiment of the invention, an area of the first cell and/or of the n-th cell is in each case greater than an area of the cells 2 to n−1.

In a preferred embodiment of the invention, the at least one busbar is electrically conductively contacted with that electrode of the cells which has the higher surface conductivity, wherein the sheet resistance of the more highly conductive electrode is less than 10 ohms per square, preferably less than 1 ohm per square, or preferably 0.1 ohm per square.

In a preferred embodiment of the invention, the top electrode of the cell is the more highly electrically conductive electrode and the bottom electrode of the cell is the less electrically conductive electrode, wherein preferably the less electrically conductive electrode has a sheet resistance of less than 10 ohms per square, preferably less than 1 ohm per square.

In a preferred embodiment of the invention, the photovoltaic element has at least one cell comprising at least one photoactive layer, in particular a CIS cell, a CIGS cell, a GaAs cell, or an Si cell, a perovskite cell, or an organic photovoltaic element (OPV), a so-called organic solar cell.

In a preferred embodiment of the invention, the photovoltaic element has a layer system comprising at least two photoactive layers, wherein the photovoltaic element is a tandem cell, preferably a layer system comprising at least three photoactive layers, wherein the photovoltaic element is a triple cell.

In a preferred embodiment of the invention, the at least one busbar is arranged in the longitudinal direction L of one cell.

A longitudinal direction L of a cell is understood to mean in particular a direction of a cell of a photovoltaic element with the longest extent thereof.

Preferably, a plurality of cells arranged next to one another on a substrate of a photovoltaic element are interconnected in series among one another.

The photovoltaic element according to an embodiment of the invention has advantages in comparison with the prior art. Advantageously, damage to the first and/or the n-th cell with the at least one busbar, in particular a resultant loss of functional area, is compensated for by the larger extent of the first and/or the n-th cell. Advantageously, upon degradation of the first and/or the n-th cell at the via points, in particular upon ingress of moisture and/or oxygen, a still sufficiently functional area of the first cell and/or the n-th cell with the busbar is maintained. Advantageously, the first cell and/or the n-th cell with the at least one busbar can continue to generate at least as much photocurrent as the other cells over a longer lifetime. Advantageously, further damage to a cell is at least partly prevented by means of the structuring line and/or separating lines. Advantageously, the number of via points, or the total area of the via points through which moisture can penetrate into the cell, is reduced. Advantageously, the function of the photovoltaic element is maintained in particular upon relatively pronounced aging of the photovoltaic element. Advantageously, the efficiency of a photovoltaic element can be improved. Advantageously, the lifetime of photovoltaic elements is increased.

In accordance with an embodiment of the invention, it is provided that each of the n cells has in each case a specific width B and a specific length L, wherein the first cell and/or the n-th cell have/has a larger width B in comparison with the cells 2 to n−1 and the n cells each have an identical length L, wherein preferably the n cells from the first cell to the n-th cell are arranged against one another on their longitudinal sides, and/or an area of the cells 2 to n−1 is of identical magnitude among one another, such that the photocurrent generation of the first cell and/or of the n-th cell upon homogeneous illumination from a side of the photovoltaic element facing away from the at least one busbar is at least of identical magnitude in comparison with the cells 2 to n−1, preferably is greater by at least 5%, preferably is greater by at least 10%, or preferably is greater by at least 20%. Preferably, the photocurrent generation of the cells relates to a time before the beginning of aging of the cells, i.e. aging as a result of mechanical loading, contact with atmospheric oxygen, contact with moisture, and/or aging over time.

In a preferred embodiment of the invention, the cells 2 to n−1 have an identical width and an identical length.

In accordance with an embodiment of the invention, it is provided that between the at least one busbar and the top electrode and/or the layer system of the cells, preferably of the first and/or the n-th cell, there is arranged a protective layer, preferably a protective film, having a mechanical protection function, an oxygen barrier function and/or a moisture barrier function, which is at least partly perforated in the surrounding zone around the via points. In a preferred embodiment of the invention, the at least one protective layer forms an encapsulation of the photovoltaic element.

A protective layer is understood to mean in particular a barrier layer for preventing the possible passage of external influences, in particular atmospheric oxygen and/or moisture, a protective layer for increasing the mechanical durability, in particular scratch resistance, and/or a filter layer, preferably a layer with a UV filter.

In a preferred embodiment, the at least protective layer has a layer thickness of 250 nm to 500 µm, preferably of 250 nm to 100 µm, preferably of 250 nm to 100 µm, or preferably of 100 µm to 200 µm, preferably of 10 µm to 100 µm, preferably of 10 µm to 50 µm, or preferably of 20 µm to 40 µm.

In a preferred embodiment of the invention, the protective layer is an SiOCH layer between the cell and the busbar, wherein the via point is formed between the cell and the busbar through the SiOCH layer.

In a preferred embodiment of the invention, the length of the cells is at least double the magnitude of the width of the cells, preferably at least five times the magnitude thereof, preferably at least 10 times the magnitude thereof, preferably at least 20 times the magnitude thereof, preferably at least 50 times the magnitude thereof, preferably at least 100 times the magnitude thereof, or preferably at least 1000 times the magnitude thereof.

In a preferred embodiment of the invention, the optoelectronic component is contacted with the at least one busbar by means of the electrically conductive contacting from the side facing away from the sun as intended.

In association with embodiments of the invention, a side of the photovoltaic element facing away from the sun is understood to mean a back side of the photovoltaic element, which as intended is not situated on a side facing incidence of light. Accordingly, in association with embodiments of the invention, a side of the photovoltaic element facing the sun is understood to mean a front side of the photovoltaic element, which as intended is situated on a side facing incidence of light.

In accordance with an embodiment of the invention, it is provided that the first cell has a smaller width B in comparison with the cells 2 to n and the n cells each have an identical length L, wherein the first cell is preferably at least largely not photoactive or electrically bridged.

In a preferred embodiment of the invention, the ratio of width to length of a cell is 1 to 10 to 1 to 1000, preferably 1 to 10 to 1 to 500, preferably 1 to 10 to 1 to 300, preferably 1 to 10 to 1 to 100, preferably 1 to 100 to 1 to 1000, preferably 1 to 100 to 1 to 500, or preferably 1 to 100 to 1 to 300.

In a preferred embodiment of the invention, the cells are arranged on the substrate one below another at least largely parallel to one another.

In a preferred embodiment of the invention, the via points have a cross-sectional area of 0.1 to 100 mm$^2$, preferably of 0.1 to 25 mm$^2$, preferably of 0.2 to 10 mm$^2$, preferably of 0.2 to 1 mm$^2$, preferably of 1 to 2 mm$^2$, or preferably of 1 to 1.5 mm$^2$.

In accordance with an embodiment of the invention, it is provided that the via points are formed at a distance of at least 1 cm from one another in the longitudinal direction of the busbar, preferably at a distance of at least 2 cm from one another, preferably at a distance of at least 5 cm from one another, preferably at a distance of at least 10 cm from one another, or preferably at a distance of at least 20 cm from one another.

In accordance with an embodiment of the invention, it is provided that the width B of the cells 2 to n−1 is 0.5 cm to 5 cm, preferably 1 cm to 5 cm, and/or a length L of the cells 1 to n is 10 cm to 20 m, preferably 20 cm to 10 m, or preferably 50 cm to 5 m.

In accordance with an embodiment of the invention, it is provided that the width B of the first cell and/or of the n-th cell is increased in comparison with the cells 2 to n−1 by at least 5%, preferably by at least 10%, preferably by at least 20%, or preferably by at least 25%, such that the photocurrent generation of the first cell and/or of the n-th cell upon homogeneous illumination from a side of the photovoltaic element facing away from the at least one busbar is greater in comparison with the cells 2 to n−1, preferably by at least 5%, preferably by at least 10%, or preferably by at least 20%.

In accordance with an embodiment of the invention, it is provided that either the bottom electrode or the top electrode in the surrounding zone around the via points is electrically conductively isolated from the respective electrode in the rest of the layer system of the first cell and/or of the n-th cell in each case by a closed structuring line, preferably a circular or rectangular structuring line, such that shunt current paths that occur between the bottom contact and the top contact in the surrounding zone around the via points do not lead to a short circuit for the corresponding first cell and/or n-th cell. As a result, damage to the cells, in particular to the first cell and/or to the second cell, as a result of shunt current paths that occur between the bottom electrode and the top electrode does not lead to a short circuit in relation to the first cell and/or the n-th cell beneath the at least one busbar.

In a preferred embodiment of the invention, either the bottom electrode or the top electrode in the region of the via points is electrically conductively isolated from the respective other electrode by means of the structuring lines.

In a preferred embodiment of the invention, either the bottom electrode or the top electrode in the surrounding zone around the via points is electrically conductively isolated from the respective electrode in the rest of the layer system of the first cell and/or of the n-th cell in each case by a closed structuring line, preferably a circular or rectangular structuring line, such that shunt current paths that occur between the bottom electrode and the top electrode in the surrounding zone around the via points do not lead to a short circuit for the first cell and/or the n-th cell.

A structuring line is understood to mean in particular a surface curve that results in electrical isolation of the layer system from the bottom electrode or the top electrode between the respective electrode in the surrounding zone around the via point and the respective electrode outside the surrounding zone around the via point, wherein preferably one of the two electrodes is electrically insulated, wherein the structuring line is formed in the horizontal direction with respect to the layer system around the complete circumference of the via points, with the surrounding zone around the via points, and is formed in the vertical direction with respect to the layer system by exactly one chosen from the bottom electrode or the top electrode, preferably supplementarily wholly or at least partly through the layer system. In plan view, the surface curve appears as a line or curve. The structuring lines are formed by means of laser ablation, in particular.

In accordance with an embodiment of the invention, it is provided that the surrounding zone around the via points has in each case no layer system comprising a photoactive layer or at least no layer system comprising a complete photoactive layer; preferably, the via points have no layer system comprising a photoactive layer.

In accordance with an embodiment of the invention, it is provided that the layer system of the cells in each case in the surrounding zone around the via points, in a region around the via points, additionally has a separating line, which at least partly prevents diffusion of moisture, which has penetrated at the via points, into the layer system outside the surrounding zone around the via points. The separating line is preferably formed by means of laser ablation, wherein preferably the separating line either spatially coincides with the structuring line 23 in the bottom electrode 5 or the top electrode 7 or is situated within the region delimited by the structuring line 23.

A separating line is understood to mean in particular a spatial separation of the layer system from the via points with the surrounding zone around the via points within the boundary provided by a structuring line, wherein the separating line is formed in the horizontal direction with respect to the layer system around the complete circumference of the via points with the surrounding zone around the via points, and is formed in the vertical direction with respect to the layer system by the entire layer system or at least partly through the layer system, wherein at least one of the electrodes or both electrodes of the layer system is/are at least largely maintained. The separating lines are formed by means of laser ablation, in particular.

Photovoltaic cells are differentiated into single, tandem or multiple cells depending on the number of photoactive layer systems which may be separated by transport layers and further layers in the layer stack between both bottom and top contacts. Tandem and multiple cells consist of at least two subcells arranged one above another between the electrodes, wherein each subcell comprises at least one photoactive layer system.

In a preferred embodiment of the invention, the layer system has at least two photoactive layers, wherein the photovoltaic cell is a tandem cell, preferably at least three photoactive layers, wherein the photovoltaic cell is a triple cell.

In a preferred embodiment of the invention, the layer system additionally has at least one charge carrier transport layer, wherein the at least one charge carrier transport layer is arranged between the bottom electrode or the top electrode and a photoactive layer, preferably at least a first charge carrier transport layer and a second charge carrier transport layer, wherein the first charge carrier transport layer is arranged between the bottom electrode and the at least one photoactive layer, and wherein the second charge carrier transport layer is arranged between the at least one photoactive layer and the top electrode.

In a preferred embodiment of the invention, the photovoltaic element has at least one inactive region, i.e. a region in which although a layer system, in particular a photoactive layer, is present, the latter is inactivated, in particular by means of corresponding laser structuring; preferably, the first cell is inactivated.

In a preferred embodiment of the invention, the first cell of the photovoltaic element is inactivated or not interconnected in series with the other cells 2 to n.

In accordance with an embodiment of the invention, it is provided that the photovoltaic element is a photovoltaic thin-film element, preferably an organic photovoltaic thin-film element and/or a flexible photovoltaic thin-film element, wherein the photovoltaic thin-film element preferably has at least one photoactive layer composed of small molecules as absorber material.

In a preferred embodiment of the invention, the photovoltaic element is an organic photovoltaic element, preferably a flexible organic photovoltaic element, wherein preferably at least one photoactive layer of the organic photovoltaic element comprises small molecules as absorber material.

A flexible photovoltaic element is understood to mean in particular a photovoltaic element which is bendable and/or extensible in a specific region.

In a preferred embodiment of the invention, the photovoltaic element has at least a first busbar and a second busbar, wherein the first busbar is connected to the first cell by means of a first electrically conductive contacting and the second busbar is electrically conductively connected to the n-th cell by means of a second electrically conductive contacting.

In a preferred embodiment of the invention, the photovoltaic element has a junction box, wherein the at least one busbar is electrically conductively connected to the junction box. A junction box is understood to mean in particular an element for connecting the photovoltaic element to an external electrical circuit. In one preferred embodiment of the invention, the first busbar and the second busbar are electrically conductively connected to the junction box.

Exemplary Embodiments

FIG. 1 shows a schematic illustration of one exemplary embodiment of a layer system 9 of a photovoltaic element 1 in a side view.

In this exemplary embodiment, the photovoltaic element 1 consists of cells 3 composed of a sequence of thin layers comprising a photoactive layer 10, which preferably are applied by vapor deposition in a vacuum or are processed from a solution. The electrical linking, i.e. a contacting, is effected by means of metal layers, transparent conductive oxides and/or transparent conductive polymers. Such a cell 3 comprising a layer system 9 is illustrated in FIG. 1.

In this exemplary embodiment, the cells 3 of the photovoltaic element 1 have a bottom electrode 5 arranged on a substrate 27, for example composed of glass, in particular a transparent bottom electrode 5, for example composed of ITO. The layer system 9 is formed thereon, said layer system comprising a charge transport layer 20 comprising Fulleren $C_{60}$, a photoactive layer 10 comprising at least one absorber material and Fulleren $C_{60}$, and a charge transport layer 22 composed of di-NPB and NDP9. A top electrode 7 composed of gold is arranged thereon. The layer system 9 and/or the electrodes 5, 7 are/is laser-structured. The layer system 9 can have further hole injection layers, hole transport layers, photoactive layers and/or electron transport layers.

The relative sizes of the cells 3, the layers of the layer system 9 and the substrate 27 are not shown true to scale.

The structuring of the individual layers and of the electrodes can be effected for example by means of laser ablation, electron or ion beam ablation, mechanical scribing or shadow masks. This results in the production of holes and/or slots in the layer system 9, for example, which serve for leading the bottom electrode 5 through the layer system 9, such that the via points are formed between the electrodes 5, 7 (P2 structuring). Structurings in the bottom electrode 5 (P1 structuring) and in the top electrode 7 (P3 structuring) are furthermore required for series interconnection of the cells within the photovoltaic element. Furthermore, structuring lines can arise which encompass the complete cell 3 composed of the electrodes 5, 7 and the layer system 9 (P4 structuring).

Figure 2:
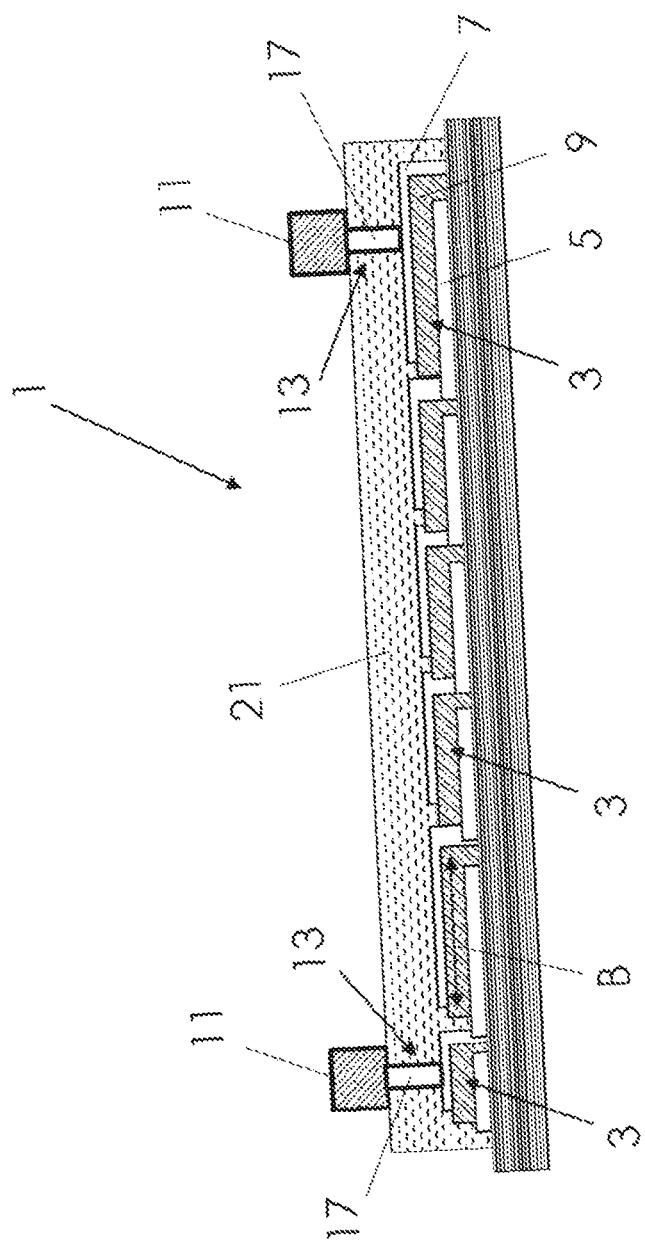
FIG. 2 shows a schematic illustration of an exemplary embodiment of a photovoltaic element comprising a plurality of series-connected cells with an electrically conductive contacting in a side view.

FIG. 2 shows a schematic illustration of one exemplary embodiment of a photovoltaic element 1 comprising a plurality of series-connected cells 3 with an electrically conductive contacting in a side view. Identical and functionally identical elements are provided with the same reference signs, and so in this respect reference is made to the preceding description.

The photovoltaic element 1 in this exemplary embodiment is a photovoltaic element 1 using thin-film technology.

The photovoltaic element 1 has a number n of cells 3 arranged on a substrate 27, from a first cell 3 to an n-th cell 3, wherein the cells 3 each have a bottom electrode 5, a top electrode 7 and a layer system 9 comprising at least one photoactive layer 10, wherein the layer system 9 is arranged between the bottom electrode 5 and the top electrode 7, and the cells 3 are interconnected in series among one another. The photovoltaic element 1 has at least one busbar 11 connected to the first cell 3 and/or the n-th cell 3 by means of an electrically conductive contacting 13. The electrically conductive contacting 13 of the at least one busbar 11 with the top electrode 7 of the first cell 3 and/or the top electrode 7 of the n-th cell 3 is formed by means of via points 17 arranged in each case at specific distances A 15 from one another in the longitudinal direction of the busbar 11, preferably at periodic distances 15. No electrically conductive contacting is formed between the top electrode 7 and the at least one busbar 11 in regions between the individual via points 17. A surrounding zone 19 around the via points 17, in a surrounding circle with a diameter of less than A/2, preferably less than A/4, is not photoactive or is at least photoactive to a reduced extent. In this exemplary embodiment, the bottom electrode 5, the top electrode 7, and the layer system 9 are laser-structured for the purpose of forming the cells 3 and for the purpose of interconnecting the cells 3 in series. In this case, in an embodiment of the invention, the at least one busbar 11 is formed from aluminum, or tin and copper.

In this exemplary embodiment, between the at least one busbar 11 and the top electrode 7 and/or the layer system 9 of the cells 3, preferably of the first and/or the n-th cell 3, there is arranged a protective layer 21, preferably a protective film, having a mechanical protection function, an oxygen barrier function and/or a moisture barrier function, which is at least partly perforated in the surrounding zone 19 around the via points 17.

In this exemplary embodiment, the cell 3 arranged on the left, which corresponds to the first cell 3, has a smaller width B in comparison with the other cells 3 (2 to n), the cell 3 arranged on the right, which corresponds to the n-th cell 3, has a larger width B in comparison with the other cells (1 to n−1), and the middle cells 3 (2 to n−1) each have an identical width B. As a result, with the cells 3 each having an identical length, the area of the first cell 3 of the photovoltaic element 1 is the smallest and the area of the n-th cell 3 of the photovoltaic element 1 is the largest. In this exemplary embodiment, the first cell 3 is not integrated into the series interconnection, that is to say that the first cell 3 does not contribute to a photovoltage, and so its area can be minimized.

In this exemplary embodiment, the layer system 9 has one photoactive layer 10; alternatively, the layer system can also have two, three or four photoactive layers 10.

In this exemplary embodiment, the first cell 3 of the photovoltaic element 1 has a width B that is smaller in comparison with the width of the cells 3 2 to n−1, and is therefore inactivated, in particular by means of corresponding laser structuring, or is not interconnected in series with the other cells 3 2 to n. As a result, the first cell 3 having a smaller area does not limit the power of the entire photovoltaic element 1. In an alternative embodiment thereto, the first cell 3 has a larger width B in comparison with the cells 3 2 to n−1, in particular a width B corresponding to the width B of the n-th cell 3, and is activated and interconnected in series with the other cells 3 2 to n. In this embodiment, the larger area of the first cell 3 in comparison with the cells 3 2 to n does not have a limiting effect on the power of the entire photovoltaic element 1.

As a result, damage to the first and/or n-th cell with the at least one busbar, in particular a resultant loss of functional area, is compensated for by the greater extent of the first and/or n-th cell. Upon ingress of moisture at the via points, a sufficient functional area of the first cell and/or n-th cell with the busbar is still maintained. Advantageously, the lifetime of photovoltaic elements is increased.

In an embodiment of the invention, each of the n cells 3 has in each case a specific width B and a specific length L, wherein the first cell 3 and/or the n-th cell 3 have/has a larger width B in comparison with the cells 3 2 to n−1 and the n cells 3 each have an identical length L, wherein preferably the n cells 3 from the first cell 3 to the n-th cell 3 are arranged against one another on their longitudinal sides, and/or an area of the cells 3 2 to n−1 is of identical magnitude among one another, such that the photocurrent generation of the first cell 3 and/or of the n-th cell 3 upon homogeneous illumination from a side of the photovoltaic element 1 facing away from the at least one busbar 11 is at least of identical magnitude in comparison with the cells 3 2 to n−1, preferably is greater by at least 5%, preferably is greater by at least 10%, or preferably is greater by at least 20%.

In a further embodiment of the invention, the first cell 3 has a smaller width B in comparison with the cells 3 2 to n and the n cells 3 each have an identical length L, wherein the first cell 3 is preferably at least largely not photoactive or electrically bridged. Preferably, the first cell 3 is not included in the series interconnection or the first cell 3 is electrically bridged and thus does not have a current-limiting effect in regard to the series interconnection.

In a further embodiment of the invention, the first cell 3 is not a complete cell, but rather comprises a bottom electrode 5 or a top electrode 7, in particular that electrode selected from the bottom electrode 5 and the top electrode 7 which has the higher surface conductivity.

In a further embodiment of the invention, the busbar 11 at the first cell 3 is formed with a greater width than the first cell 3, such that the busbar 11 partly lies over the second cell 3, but is electrically conductively isolated from the second cell 3 by means of the protective layer 21.

In a further embodiment of the invention, the via points 17 are formed at a distance 15 of at least 1 cm from one another in the longitudinal direction of the busbar 11, preferably at a distance 15 of at least 2 cm from one another, preferably of at least 5 cm from one another, preferably of at least 10 cm from one another, or preferably of at least 20 cm from one another.

In a further embodiment of the invention, the width B of the cells 3 2 to n–1 is 0.5 cm to 5 cm, preferably 1 cm to 5 cm, and/or a length L of the cells 3 1 to n is 10 cm to 20 m, preferably 50 cm to 20 m, and/or the width B of the first cell 3 and/or of the n-th cell 3 is increased in comparison with the cells 3 2 to n–1 by at least 5%, preferably by at least 10%, preferably by at least 20%, or preferably by at least 25%, such that the photocurrent generation of the first cell 3 and/or of the n-th cell 3 upon homogeneous illumination from a side of the photovoltaic element 1 facing away from the at least one busbar 11 is greater in comparison with the cells 3 2 to n–1 preferably by at least 5%, preferably by at least 10%, or preferably by at least 20%.

In a further embodiment of the invention, either the bottom electrode or the top electrode in the surrounding zone 19 around the via points 17 is electrically conductively isolated from the respective electrode 5, 7 in the rest of the layer system of the first cell 3 and/or of the n-th cell 3 in each case by a closed structuring line 23, preferably a circular or rectangular structuring line 23, such that shunt current paths that occur between the bottom contact 5 and the top contact 7 in the surrounding zone 19 around the via points 17 do not lead to a short circuit for the corresponding first cell 3 and/or n-th cell 3.

In a further embodiment of the invention, in a region of the structuring line 23 next to the bottom electrode 5 or the top electrode 7, the layer system 9 is also wholly or at least partly interrupted, such that diffusion, in particular lateral diffusion, of moisture and/or atmospheric oxygen in the surrounding zone 19 around the via points 17 may be prevented or at least reduced.

In a further embodiment of the invention, the surrounding zone 19 around the via points 17 has in each case no layer system 9 comprising a photoactive layer 10 or at least no layer system 9 comprising a complete photoactive layer 10; preferably, the via points 17 have no layer system 9 comprising a photoactive layer 10.

In a further embodiment of the invention, the layer system 9 of the cells 3 in each case in the surrounding zone 19 around the via points 17, in a region around the via points 17, additionally has a separating line, which at least partly prevents diffusion of moisture, which has penetrated at the via points 17, into the layer system 9 outside the surrounding zone 19 around the via points 17. As a result, further damage to a cell is at least partly prevented. In an embodiment of the invention, the separating line can coincide with the structuring line 23 in the bottom electrode 5 or the top electrode 7 or can be situated within the region delimited by the structuring line 23, in particular can have a smaller diameter in comparison with the structuring line 23.

In a further embodiment of the invention, the photovoltaic element 1 is a photovoltaic thin-film element, preferably an organic photovoltaic thin-film element and/or a flexible photovoltaic thin-film element, wherein the photovoltaic thin-film element preferably has at least one photoactive layer 10 composed of small molecules as absorber material.

In an embodiment, the electrically conductive contacting with the at least one via point 17 between the top electrode 7 of the cell 3 and the at least one busbar 11 can be produced as follows:

A) by means of local laser ablation or targeted mechanical damage of an insulating layer between the top electrode 7 and the busbar 11, and subsequent electrically conductive connection by means of conductive PSA or conductive adhesive, for example UV-curing or thermally curing epoxy or acrylic adhesive;

B) applying a structured insulation layer by means of printing or coating methods, preferably in conjunction with lithography steps, such that the insulation layer is interrupted at the desired points, and subsequent electrically conductive connection by means of conductive PSA or conductive adhesive, for example UV-curing or thermally curing epoxy or acrylic adhesive;

C) applying topographically sophisticated conductive structures to the top electrode 7 of the cell 3, for example by means of a conductive adhesive, or by means of roughening the top electrode 7, for example by means of a laser, followed by applying a thin insulation layer, which leads to insulation between cell and busbar everywhere apart from in the region of the topographically complex zone.

In a further exemplary embodiment, for the purpose of contacting in accordance with A), the insulating layer 21, which is preferably formed from SiOCH, is removed regionally by means of scraping or laser treatment of the layer 21 and is electrically conductively connected by subsequent application of a drop of conductive adhesive, for example silver-containing adhesive.

Figure 3:
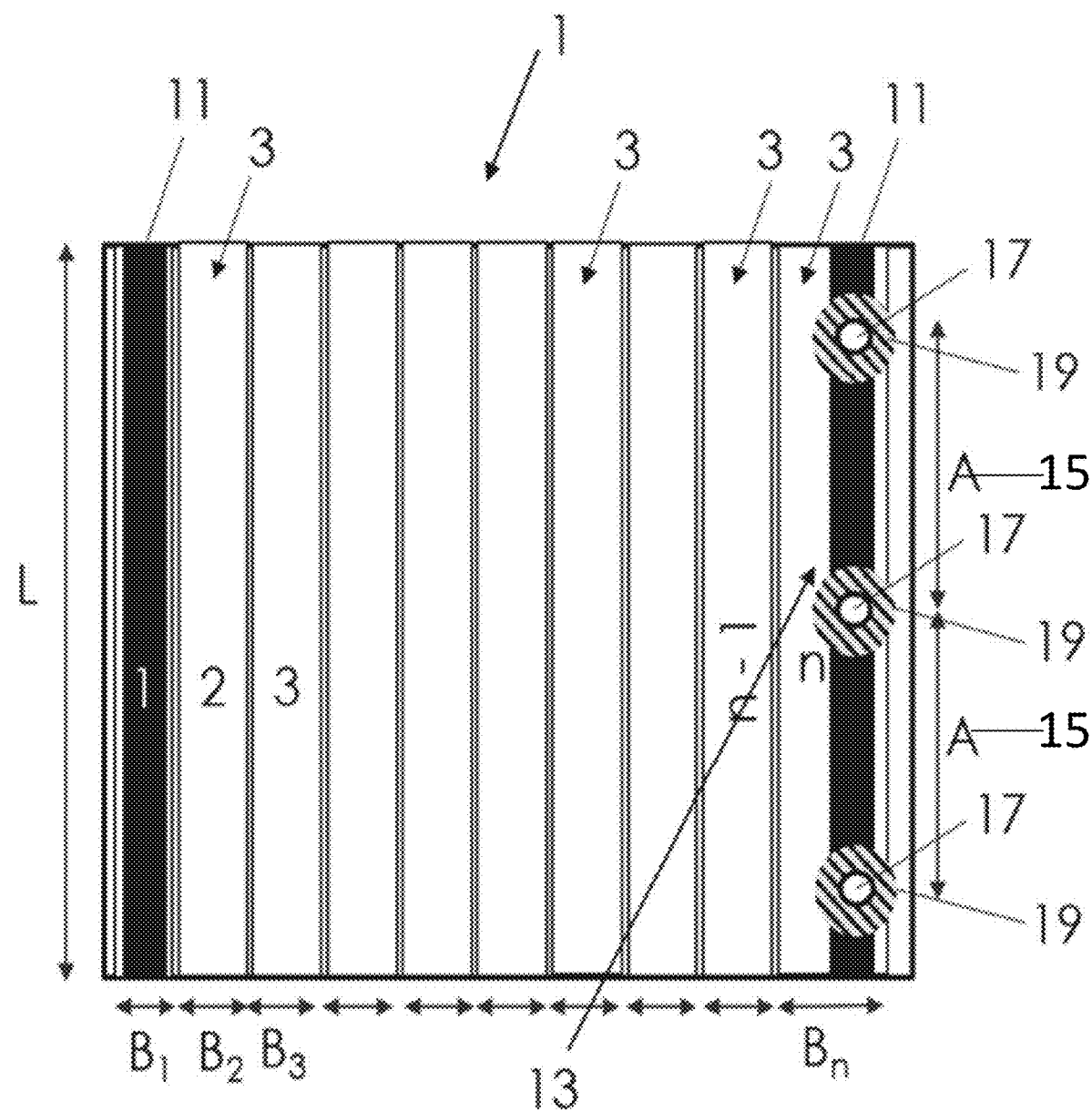
FIG. 3 shows a schematic illustration of an exemplary embodiment of a photovoltaic element comprising a plurality of series-connected cells with an electrically conductive contacting comprising via points arranged at a distance A from one another, in a plan view.

FIG. 3 shows a schematic illustration of one exemplary embodiment of a photovoltaic element 1 comprising a plurality of series-connected cells 3 with an electrically conductive contacting 13 comprising via points 17 arranged at a distance A from one another, in a plan view. Identical and functionally identical elements are provided with the same reference signs, and so in this respect reference is made to the preceding description.

The cells 3 1 to n–1 have a smaller width B (B1 to Bn–1) in comparison with the width B of the cell n (Bn). The length L of the cells 3 is formed identically in each case. The length L of the cells 3 here is greater than the width B of the cells 3. The photovoltaic element 1 in this exemplary embodiment is a photovoltaic element 1 using thin-film technology.

The area of the cells 3 2 to n–1 interconnected in series in the transverse direction Q is identical, and the area of the n-th cell 3 is larger in comparison with the other cells 3. A respective busbar 11 is arranged on the first cell 3 and on the n-th cell 3. The busbar 11 on the n-th cell 3 has three via points 17, which are formed at a distance A from one another in the longitudinal direction of the busbar 11, whereby an electrically conductive contacting 13 to the top electrode 7 of the n-th cell 3 is formed. A region with a reduced photocurrent generation is in each case situated in a surrounding zone 19 around the via points 17.

In this exemplary embodiment, the first cell 3 given a width B that is smaller in comparison with the width of the cells 3 2 to n–1 and n, is inactive or at least largely inactive, in particular owing to the covering by the busbar 11, or inactivated.

Figure 4:
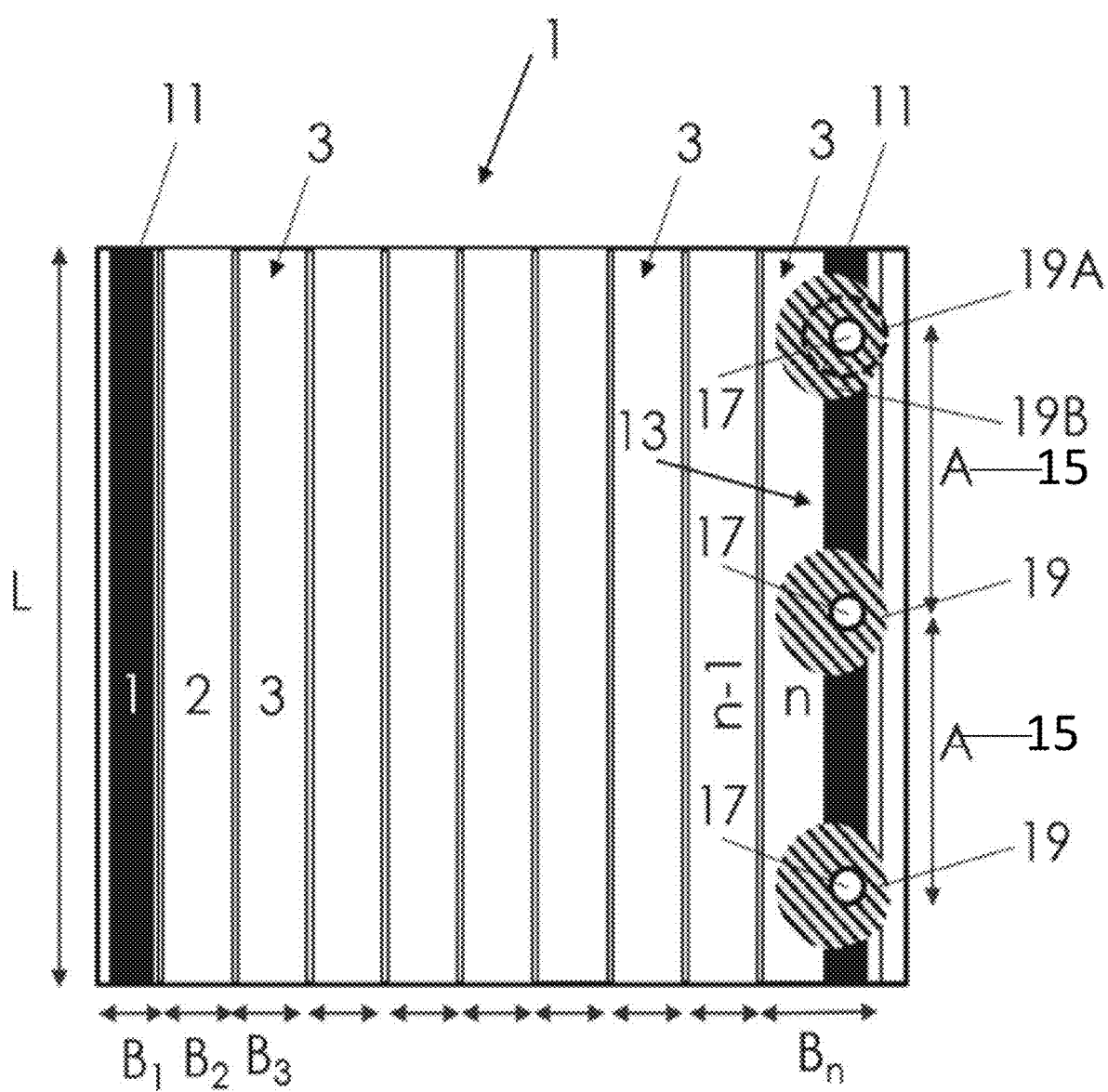
FIG. 4 shows a schematic illustration of an exemplary embodiment of a photovoltaic element comprising a plurality of series-connected cells with an electrically conductive contacting comprising via points arranged at a distance A from one another, in a plan view.

FIG. 4 shows a schematic illustration of one exemplary embodiment of a photovoltaic element 1 comprising an electrically conductive contacting 13 comprising via points 17 arranged at a distance A from one another in a plan view. Identical and functionally identical elements are provided with the same reference signs, and so in this respect reference is made to the preceding description.

The cells 3 1 to n–1 have a smaller width B ($B_1$ to $B_{n-1}$) in comparison with the width B of the cell n ($B_n$), and the cell 3 1 has a smaller width B ($B_1$) in comparison with the width B ($B_2$ to $B_{n-1}$) of the cells 3 2 to n−1. The length L of the cells 3 is formed identically in each case.

A respective busbar 11 is arranged on the first cell 3 and on the n-th cell 3. The busbar 11 on the n-th cell 3 has three via points 17, which are formed at a distance A from one another in the longitudinal direction of the busbar 11, whereby an electrically conductive contacting 13 to the top electrode 7 of the n-th cell 3 is formed. A region with a reduced photocurrent generation is in each case situated in a surrounding zone 19 around the via points 17.

The surrounding zone 19 around the via points 17 is illustrated with a reduced photocurrent generation before degradation in a surrounding zone 19A around the via points 17 and is illustrated with a reduced photocurrent generation after degradation in a surrounding zone 19B around the via points 17.

In this exemplary embodiment, the first cell 3 given a width B that is smaller in comparison with the width of the cells 3 2 to n−1 and n, is inactive or at least largely inactive, in particular owing to the covering by the busbar 11, or inactivated.

Figure 5:
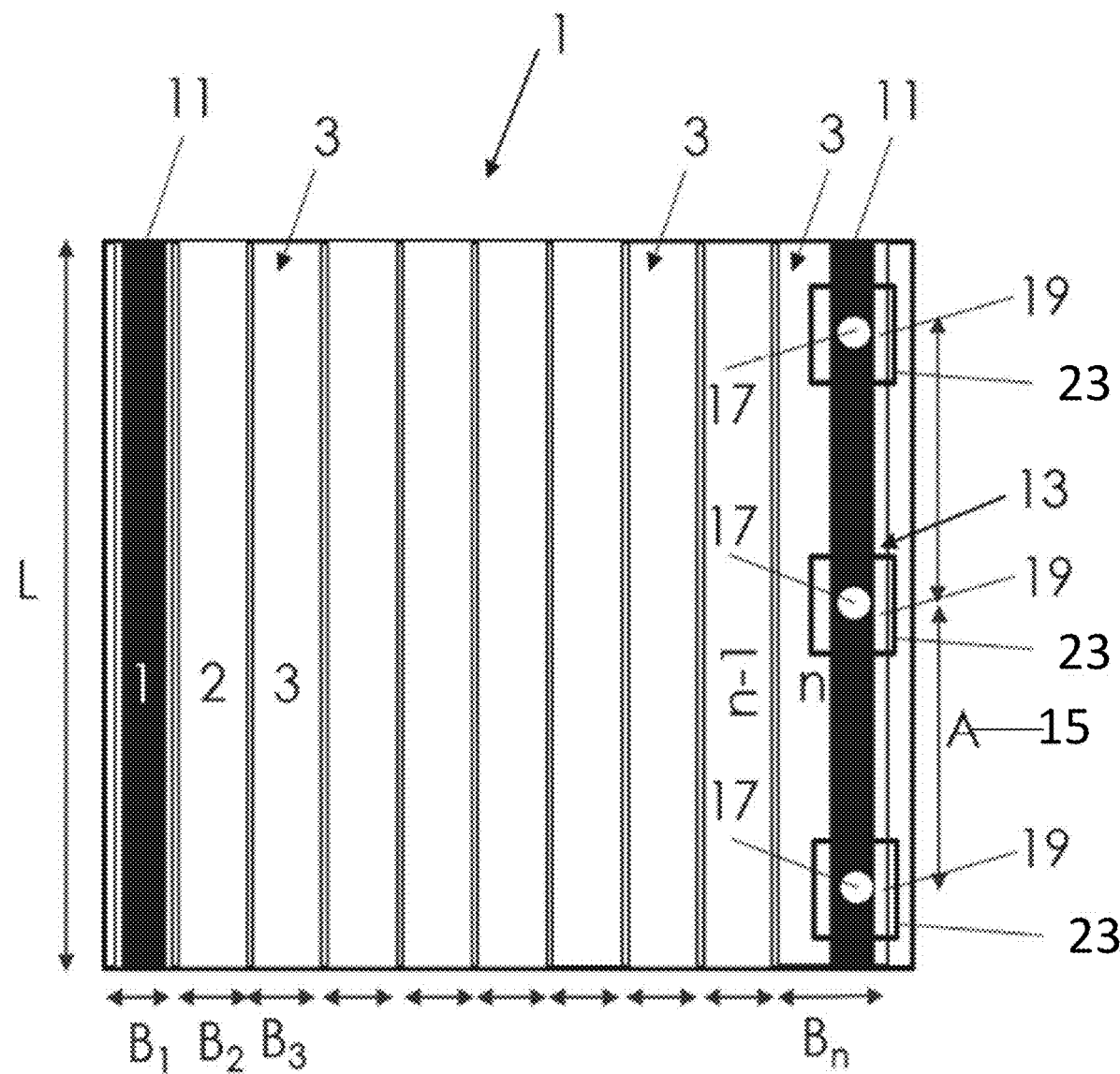
FIG. 5 shows a schematic illustration of an exemplary embodiment of a photovoltaic element comprising a plurality of series-connected cells with an electrically conductive contacting comprising via points arranged at a distance A from one another, in a plan view.

FIG. 5 shows a schematic illustration of one exemplary embodiment of a photovoltaic element 1 comprising a plurality of series-connected cells 3 with an electrically conductive contacting 13 comprising via points 17 arranged at a distance A from one another, in a plan view. Identical and functionally identical elements are provided with the same reference signs, and so in this respect reference is made to the preceding description.

The cells 3 1 to n−1 have a smaller width B ($B_1$ to $B_{n-1}$) in comparison with the width B of the cell n (Bn). The width B of the cells 1 to n−1 ($B_1$ to $B_{n-1}$) is identical. The length L of the cells 3 is formed identically in each case. The length L of the cells 3 here is greater than the width B of the cells 3. The photovoltaic element 1 in this exemplary embodiment is a photovoltaic element 1 using thin-film technology.

A respective structuring line 23 is formed in closed fashion around the via points 17 with the surrounding zone 19 around the via points 17, and separates the bottom contact 5 or the top contact 7 in the surrounding zone 19 around the via points 17 from the rest of the area of the cell 3, such that the bottom contact 5 or the top contact 7 is electrically insulated from the rest of the area of the cell 3.

In this exemplary embodiment, the first cell 3 given a width B that is smaller in comparison with the width of the cells 3 2 to n−1 and n is inactive or at least largely inactive, in particular owing to the covering by the busbar 11, or inactivated.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A photovoltaic element comprising:
a number n of cells arranged on a substrate, from a first cell to an n-th cell,
wherein the cells each have a bottom electrode, a top electrode and a layer system comprising at least one photoactive layer,
wherein the layer system is arranged between the bottom electrode and the top electrode, and the cells are interconnected in series among one another;
at least one busbar connected to the first cell and/or the n-th cell by an electrically conductive contacting,
wherein the electrically conductive contacting connects the at least one busbar with the top electrode of the first cell and/or the top electrode of the n-th cell and is formed by via points arranged in each case at specific distances A from one another in a longitudinal direction of the at least one busbar,
wherein no electrically conductive contacting is formed between the top electrode and the at least one busbar in regions between individual via points,
wherein a separate surrounding zone around each of the via points, in a surrounding circle with a diameter of less than A/2, is not photoactive or is at least photoactive to a reduced extent,
wherein each of the n cells has in each case a specific width B and a specific length L,
wherein the first cell of the n cells and/or the n-the cell of the n cells has a larger width B in comparison with the cells 2 to n−1, and the n cells each have an identical length L,
wherein either the bottom electrode or the top electrode in the surrounding zones around the via points is electrically conductively isolated from the respective electrode in the rest of the layer system of the first cell and/or of the n-th cell in each case by a closed structuring line, and
wherein the closed structuring line is in each case formed in a horizontal direction with respect to the layer system around a complete circumference of the via points with the surrounding zones around the via points, and is formed in a vertical direction with respect to the layer system by exactly one selected from the bottom electrode or the top electrode.

2. The photovoltaic element as claimed in claim 1, wherein between the at least one busbar and the top electrode and/or the layer system of the cells, there is arranged a protective layer providing a mechanical protection, an oxygen barrier and/or a moisture barrier, which is at least partly perforated in the surrounding zones around the via points.

3. The photovoltaic element as claimed in claim 1, wherein the first cell has a smaller width B in comparison with the cells 2 to n and the n cells each have an identical length L, and wherein the first cell is at least largely not photoactive or electrically bridged.

4. The photovoltaic element as claimed in claim 1, wherein the via points are formed at a distance of at least 1 cm from one another in the longitudinal direction of the at least one busbar, and wherein the first cell is electronically connected to a first busbar and the n-th cell is electrically connected to a second busbar.

5. The photovoltaic element as claimed in claim 1, wherein a width B of the cells 2 to n−1 is 0.5 cm to 5 cm, and/or a length L of the cells 1 to n is 10 cm to 20 m, and/or the width B of the first cell and/or of the n-th cell is increased in comparison with the cells 2 to n−1 by at least 5%, such that a photocurrent generation of the first cell and/or of the n-th cell upon homogeneous illumination from a side of the photovoltaic element facing away from the at least one busbar is greater in comparison with the cells 2 to n−1.

6. The photovoltaic element as claimed in claim 1, wherein either the bottom electrode or the top electrode in the surrounding zones around the via points is electrically conductively isolated from the respective electrode in the rest of the layer system of the first cell and/or of the n-th cell in each case by the closed structuring line, such that shunt current paths that occur between a bottom contact and a top contact in the surrounding zones around the via points do not lead to a short circuit for the corresponding first cell and/or n-th cell.

7. The photovoltaic element as claimed in claim 1, wherein the surrounding zone around the via points has in each case no layer system comprising a photoactive layer or at least no layer system comprising a complete photoactive layer.

8. The photovoltaic element as claimed in claim 1, wherein the layer system of the cells in each case in the surrounding zones around the via points, additionally has a separating line in a region around the via points, which at least partly prevents diffusion of moisture, which has penetrated at the via points, into the layer system outside the surrounding zones around the via points.

9. The photovoltaic element as claimed in claim 1, wherein the photovoltaic element is a photovoltaic thin-film element.

10. The photovoltaic element as claimed in claim 1, wherein the electrically conductive contacting connects the at least one busbar with the top electrode of the first cell and/or the top electrode of the n-th cell and is formed by via points arranged in each case at specific distances A from one another in the longitudinal direction of the at least one busbar at periodic distances.

11. The photovoltaic element as claimed in claim 1, wherein each of the surrounding zones is in a surrounding circle with a diameter of less than A/4.

12. The photovoltaic element as claimed in claim 1, wherein the n cells from the first cell to the n-th cell are arranged against one another on their longitudinal sides, and/or an area of the cells 2 to n−1 is of identical magnitude among one another, such that a photocurrent generation of the first cell and/or of the n-th cell upon homogeneous illumination from a side of the photovoltaic element facing away from the at least one busbar is greater by at least 5% in comparison with the cells 2 to n−1.

13. The photovoltaic element as claimed in claim 12, wherein the photocurrent generation of the first cell and/or of the n-th cell upon homogeneous illumination from the side of the photovoltaic element facing away from the at least one busbar is greater by at least 20% in comparison with the cells 2 to n−1.

14. The photovoltaic element as claimed in claim 2, wherein between the at least one busbar and the top electrode and/or the layer system of the first and/or the n-th cell, the protective layer is arranged.

15. The photovoltaic element as claimed in claim 2, wherein the protective layer is a protective film.

16. The photovoltaic element as claimed in claim 4, wherein the via points are formed at a distance of at least 10 cm from one another in the longitudinal direction of the at least one busbar.

17. The photovoltaic element as claimed in claim 6, wherein the closed structuring line is a circular or rectangular structuring line.

18. The photovoltaic element as claimed in claim 7, wherein the via points have no layer system comprising a photoactive layer.

19. The photovoltaic element as claimed in claim 1, wherein the photovoltaic element is an organic photovoltaic thin film element and/or a flexible photovoltaic thin film element.

* * * * *